United States Patent
Motonami

Patent Number: 6,162,674
Date of Patent: Dec. 19, 2000

[54] METHOD OF MANUFACTURING SEMICONDUCTOR DEVICE

[75] Inventor: Kaoru Motonami, Hyogo, Japan

[73] Assignee: Mitsubishi Denki Kabushiki Kaisha, Tokyo, Japan

[21] Appl. No.: 09/357,916

[22] Filed: Jul. 21, 1999

Related U.S. Application Data

[62] Division of application No. 08/967,614, Nov. 10, 1997, Pat. No. 5,962,907.

[30] Foreign Application Priority Data

May 8, 1997 [JP] Japan ................................ 9-117793

[51] Int. Cl.⁷ ................................................ H01L 21/8242
[52] U.S. Cl. ............................................ 438/241; 438/294
[58] Field of Search ...................... 438/241, 197, 438/198–201, 277, 278, 294, 800; 257/316

[56] References Cited

U.S. PATENT DOCUMENTS

| | | |
|---|---|---|
| 4,994,887 | 2/1991 | Hutter et al. . |
| 5,329,482 | 7/1994 | Nakajima et al. . |
| 5,400,278 | 3/1995 | Kunori et al. . |
| 5,663,084 | 9/1997 | Yi et al. . |
| 5,751,037 | 5/1998 | Aozasa et al. . |
| 5,789,293 | 8/1998 | Cho et al. . |
| 5,856,691 | 1/1999 | Hazama .................................. 257/316 |

FOREIGN PATENT DOCUMENTS

| | | |
|---|---|---|
| 0 244 367 A2 | 3/1987 | European Pat. Off. . |
| 0 713 249 A1 | 10/1995 | European Pat. Off. . |
| 63-23348 | 1/1988 | Japan . |
| 64-89457 | 4/1989 | Japan . |

*Primary Examiner*—Charles Bowers
*Assistant Examiner*—Craig Thompson
*Attorney, Agent, or Firm*—McDermott, Will & Emery

[57] ABSTRACT

A semiconductor device having a memory device and a logic device formed together on a single chip is provided. A first element region and a second element region of a semiconductor substrate are formed spaced apart from each other with an isolation region therebetween. A floating conductive film is provided on the isolation region.

5 Claims, 34 Drawing Sheets

METHOD OF MANUFACTURING SEMICONDUCTOR DEVICE

This application is a divisional of application Ser. No. 08/967,614 filed Nov. 10, 1997 is now U.S. Pat. No. 5,962,907.

BACKGROUND OF THE INVENTION

1. Field of the Invention

The present invention generally relates to semiconductor devices, and more particularly, to a semiconductor device having a memory device and a logic device formed together on a single chip. The present invention also relates to a method of manufacturing such a semiconductor device.

2. Description of the Background Art

With reference to FIG. 26, conventionally, a logic device and a memory device are formed on separate chips, which are then placed on a single board. Thus forming a memory device and a logic device on separate chips makes it difficult to maintain high speed characteristic. Accordingly, a so-called eRAM (embedded Random Access Memory), a device having a memory device and a logic device both formed on one chip has been proposed.

In such an eRAM device, the essential subject is to enhance the driving ability of a transistor for a logic device. The driving ability of a transistor can be most effectively enhanced by making a gate oxide film of a transistor thinner. On the other hand, in a memory device, particularly in a DRAM device, thinner a gate oxide film causes a problem specific to DRAM (that is, it does not work unless rising voltage level is increased because of high power supply voltage). Therefore, there is a limitation in making the gate oxide films of both transistors thinner at the same time.

Then, respective gate oxide films for a memory device and a logic device can be formed separately. A possible conventional method of forming gate oxide films separately will now be described with reference to the drawings.

With reference to FIG. 28, a silicon substrate 1 is prepared.

In the case of a device having a DRAM device and a logic device both formed on a chip, there are five types of transistors formed in portions A, B, C, D and E. A logic type NMOS transistor is formed in A, a logic type PMOS transistor in B, a DRAM cell transistor in C, a DRAM array type NMOS transistor in D and a DRAM array type PMOS transistor in E. In FIG. 28, Z represents a boundary portion in an eRAM device, that is, a boundary portion between a memory device and a logic device.

With reference to FIG. 29, an isolation oxide film 2 is formed in the main surface of silicon substrate 1 using LOCOS (Local Oxidation of Silicon method). Next, a gate oxide film 3 is formed after forming a well (not shown) as needed.

With reference to FIG. 30, a resist pattern 4 is formed on the portion other than the portion to have a thinner gate oxide film (in other words, on a portion corresponding to logic types transistors A and B requiring driving ability).

With reference to FIGS. 30 and 31, gate oxide film 3 in portions A and B is removed using resist pattern 4 as a mask to expose surface 11 of a silicon substrate. Resist pattern 4 is then removed.

With reference to FIG. 32, the surface of silicon substrate 1 is oxidized and an usual gate oxide film is formed again. At this time, the thickness of a gate oxide film 31 is larger than that of a gate oxide film 32. That is, the thickness of gate oxide film 32 in portions for transistors A and B is different from that of gate oxide film 31 for transistors C, D and E. Namely, gate oxide film 32 in portions for transistors A and B requiring driving ability is thinner than gate oxide film 31 for transistors C, D and E.

With reference to FIG. 33, a gate electrode film 5 of a transistor is formed on the entire surface of silicon substrate 1.

With reference to FIG. 34, an oxide film 6 is formed on gate electrode film 5.

With reference to FIG. 35, resist patterns 131 and 132 are formed in the portions to form gate electrodes.

With reference to FIGS. 35 and 36, oxide film 6 is etched using resist patterns 131 and 132 as masks. Subsequently, resist patterns 131 and 132 are removed.

With reference to FIG. 36, gate electrode 5 is selectively etched to form gate electrodes 511 and 811 using the resulting patterns 611 and 911 formed of the oxide films as masks.

With reference to FIG. 37, an interlayer insulation film 14 is formed on the entire surface of silicon substrate 1. The formation of contact holes and interconnection layers 15 in interlayer insulation film 14 completes an eRAM.

The foregoing is a possible method of forming gate oxide films separately. This method, however, has a following disadvantage.

With reference to FIG. 30, resist pattern 4 is directly formed on gate oxide film 31, and therefore, gate oxide film 31 contacts with various kinds of impurities (especially metal impurities) contained in resist pattern 4. As a result, the metal impurities can be injected into gate oxide film 31, thereby adversely affecting the reliability of gate oxide film 31.

SUMMARY OF THE INVENTION

Accordingly, it is an object of the present invention to provide a semiconductor device having at least two kinds of MOS structures on a semiconductor substrate.

It is another object to provide an eRAM device having a memory device and a logic device both formed on a single chip.

It is still another object to improve the driving ability of a transistor for a logic device in an eRAM device.

It is still another object to provide an eRAM device with enhanced reliability for a gate oxide film.

It is still another object to provide a method of manufacturing such a semiconductor device.

In accordance with a first aspect of the invention, a semiconductor device is provided with a semiconductor substrate on which first and second element regions are formed spaced apart from each other. An isolation region for separating the first and second element regions is provided on the semiconductor substrate. A first MOS structure having a first gate electrode and a first gate insulation film is provided on the first element region. A second MOS structure having a second gate electrode and a second gate insulation film is provided on the second element region. A conductive film is provided on the isolation region.

In a semiconductor device in accordance with a second aspect of the invention, the thickness of the first gate insulation film is different from that of the second gate insulation film.

In a semiconductor device in accordance with a third aspect of the invention, the first element region includes a memory device region and the second element region includes a logic device region.

In a semiconductor device in accordance with a fourth aspect of the invention, the conductive film is provided to surround the memory device region.

In a semiconductor device in accordance with a fifth aspect of the invention, the conductive film includes a first conductive film formed of the same component as the first gate electrode and a second conductive film formed of the same component as the second gate electrode, and the second conductive film partly overlaps the first conductive film.

In a semiconductor device in accordance with a sixth aspect of the invention, the isolation region is formed of an $SiO_2$ film.

In a semiconductor device in accordance with a seventh aspect of the invention, the first conductive film includes a first insulation film provided on the first conductive film and having the same width as the first conductive film, and the second conductive film includes a second insulation film provided on the second conductive film and having the same width as the second conductive film.

In a semiconductor device in accordance with an eighth aspect of the invention, the portion of the second conductive film overlaps the first conductive film having an anti-oxidation film interposed therebetween.

In a semiconductor device in accordance with a ninth embodiment of the invention, a sidewall spacer is provided on the sidewall of the second conductive film.

In a method of manufacturing a semiconductor device in accordance with a tenth aspect of the invention, first, an isolation region for separating first and second element regions is formed on a semiconductor substrate (first step). A first gate insulation film is formed on the first and second element regions (second step). A conductive film is formed on the entire surface of the semiconductor substrate, and an anti-oxidation film is formed on the conductive film (third step). The conductive film and the anti-oxidation film are selectively etched to be patterned, thereby forming on the first element region a first precursor film (later to be a first gate electrode of a first MOS structure) having a first conductive film and an anti-oxidation film and its end stranded on the isolation region, and at the same time exposing the surface of the second element region (fourth step). A second gate insulation film is formed by oxidation of the exposed surface of the second element region (fifth step). A second precursor film which would later be a second gate electrode of a second MOS structure is formed on the second element region such that its end strands on the end of the first precursor film formed on the separating insulation film (sixth step). The first and second precursor films are patterned such that the first gate electrode of the first MOS structure is left on the first element region, the second gate electrode of the second MOS structure on the second element region and the conductive film formed of the overlapping ends of the first and second precursor films on the isolation region (seventh step).

In a method of manufacturing a semiconductor device in accordance with an eleventh aspect of the invention, a first insulation film is formed on the conductive film prior to the formation of the anti-oxidation film on the conductive film.

In a method of manufacturing a semiconductor device in accordance with a twelfth aspect of the invention, the second precursor film includes the second conductive film and a second insulation film provided on the second conductive film.

In a method of manufacturing a semiconductor device in accordance with a thirteenth aspect of the invention, after the sixth step, a sidewall spacer is formed on the sidewall of the end of the second precursor film prior to the seventh step.

In a method of manufacturing a semiconductor device in accordance with a fourteenth aspect of the invention, the first and second element regions include a memory device region and a logic device region, respectively, and the conductive film is formed to surround the memory device region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the drawings.

Embodiment 1

Figure 1:
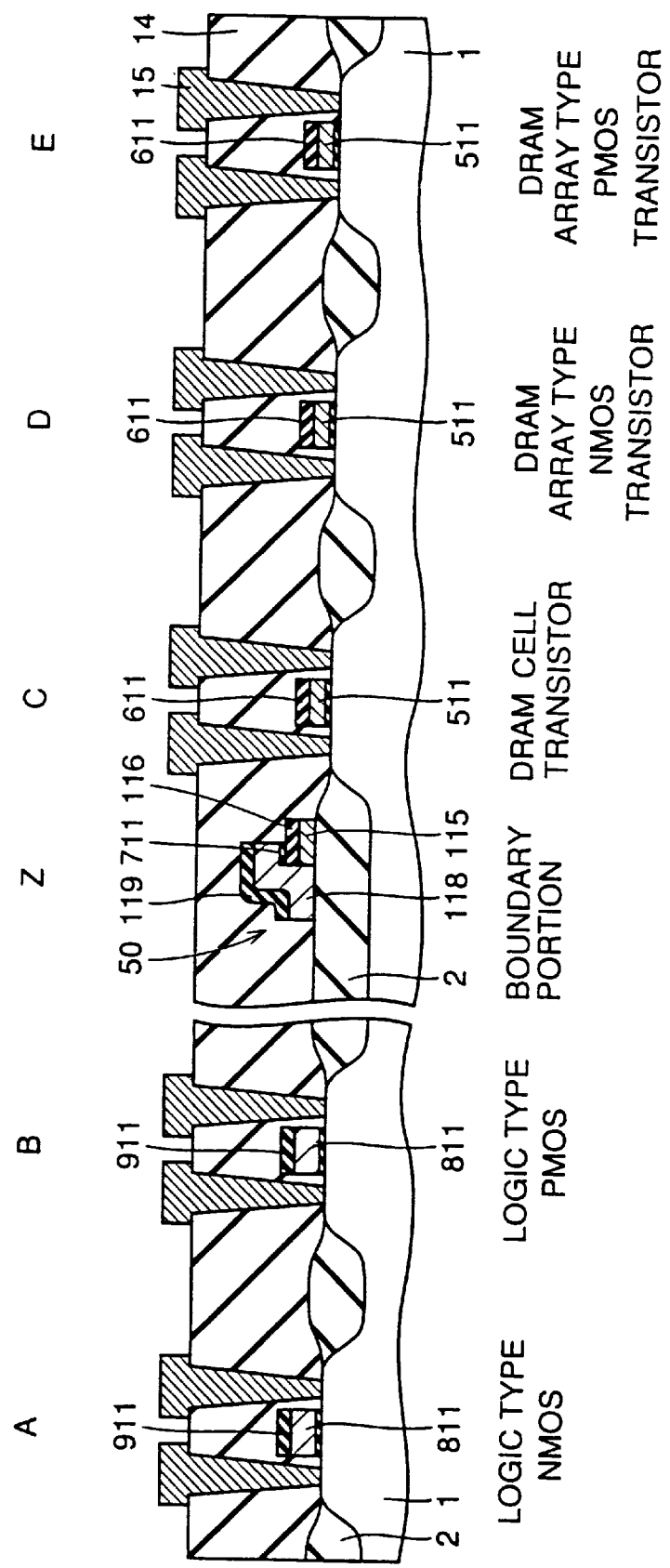
FIG. 1 is a cross sectional view showing an eRAM in accordance with an Embodiment 1.
Figure 2:
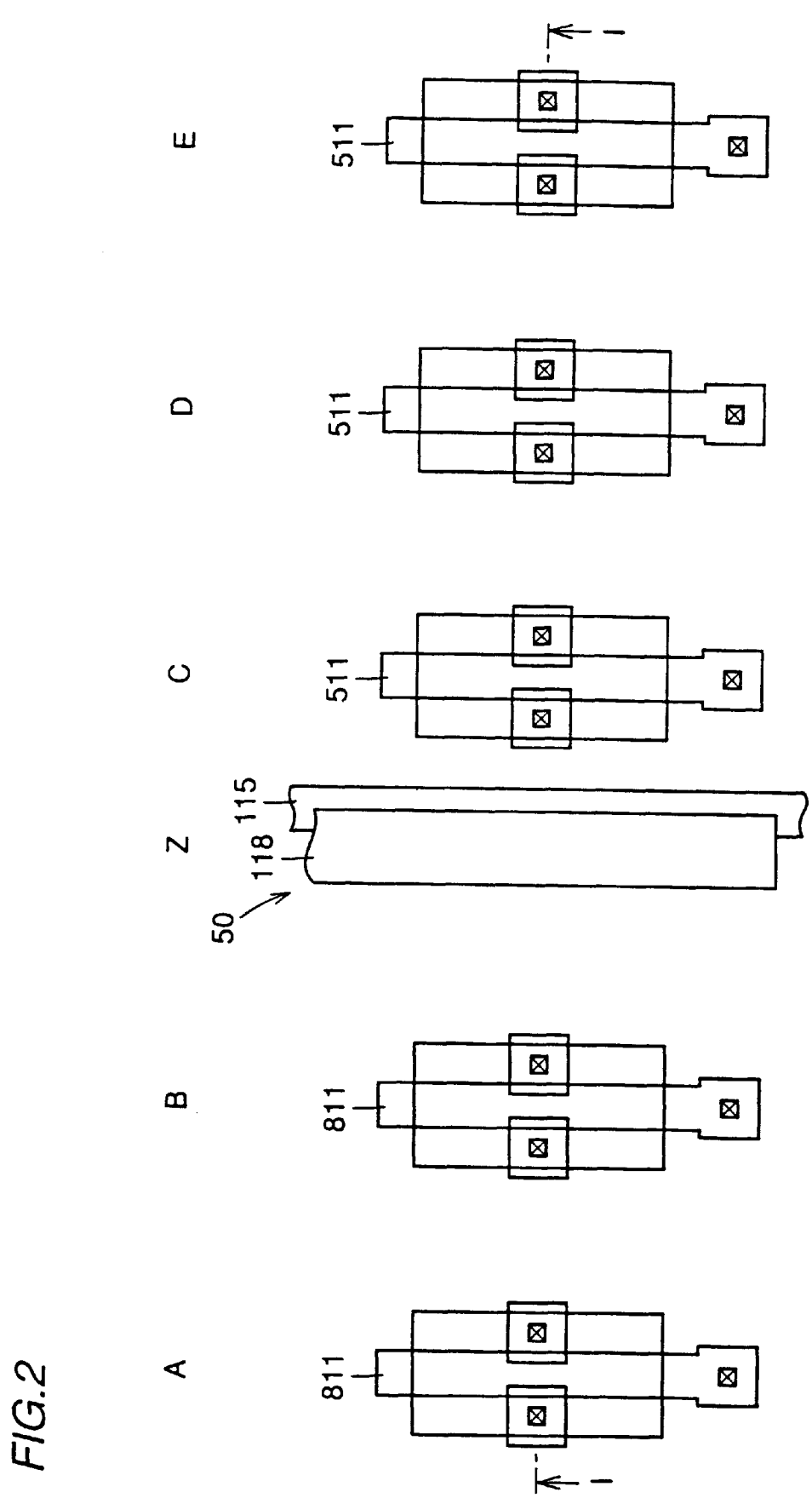
FIG. 2 is a plan view of the eRAM shown in FIG. 1.
Figure 3:
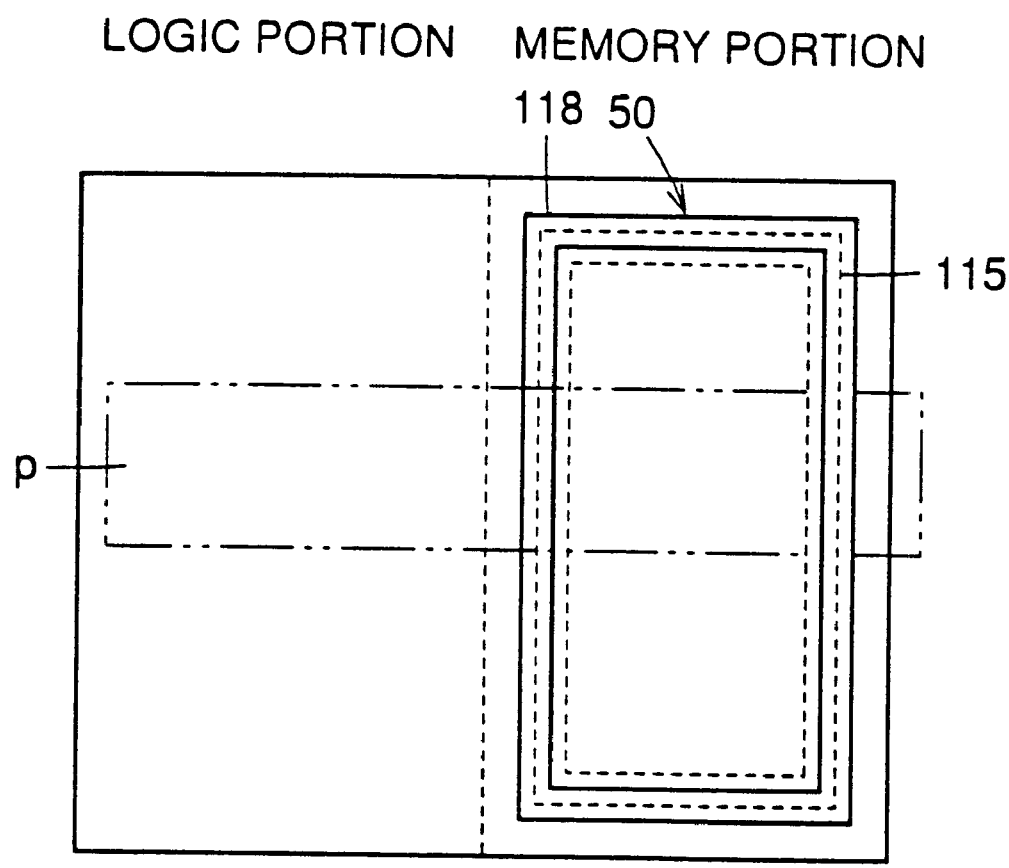
FIG. 3 is a general view of a chip with the eRAM in accordance with Embodiment 1.

FIG. 1 is a cross sectional view of a semiconductor device in accordance with the Embodiment 1 of the present invention. FIG. 2 is a plan view of a semiconductor device in accordance with Embodiment 1 (FIG. 1 is a cross sectional view taken along the line I—I in FIG. 2). FIG. 3 is a plan view of a chip with a semiconductor device in accordance with Embodiment 1 (FIG. 2 is a plan view of P region in FIG. 3).

With reference to FIGS. 1 to 3, an eRAM device in accordance with Embodiment 1 includes a logic type NMOS transistor A, a logic type PMOS transistor B, a DRAM cell transistor C, a DRAM array type NMOS transistor D and a DRAM array type PMOS transistor E formed on a silicon substrate 1. A boundary portion Z in the eRAM device, that is a boundary portion between a memory device and a logic device is provided on silicon substrate 1. A floating conductive film 50 is provided on an isolation oxide film 51 provided on boundary portion Z. Floating conductive film 50 is provided to surround memory device regions (C, D and E). Floating conductive film 50 includes a first conductive film 115 formed of the same component as a gate electrode 511 and a second conductive film 118 formed of the same component as a gate electrode 811. Second conductive film 118 is provided partly overlapping first conductive film 115. A first insulation film 116 having the same width as first conductive film 115 is provided on first conductive film 115. A second insulation film 119 having the same width as second conductive film 118 is provided on second conductive film 118. An anti-oxidation film 711 is interposed between the portion of second conductive film 118 and first insulation film 116.

A method of manufacturing an eRAM shown in FIG. 1 will now be described.

Figure 4:
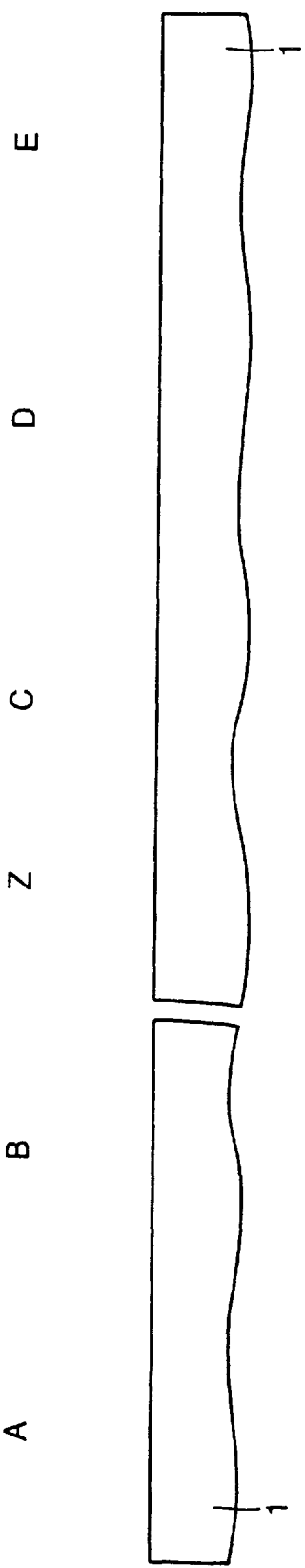
FIGS. 4 to 14 are cross sectional views showing the first to eleventh steps of a method of manufacturing a semiconductor device in accordance with Embodiment 1.
Figure 5:
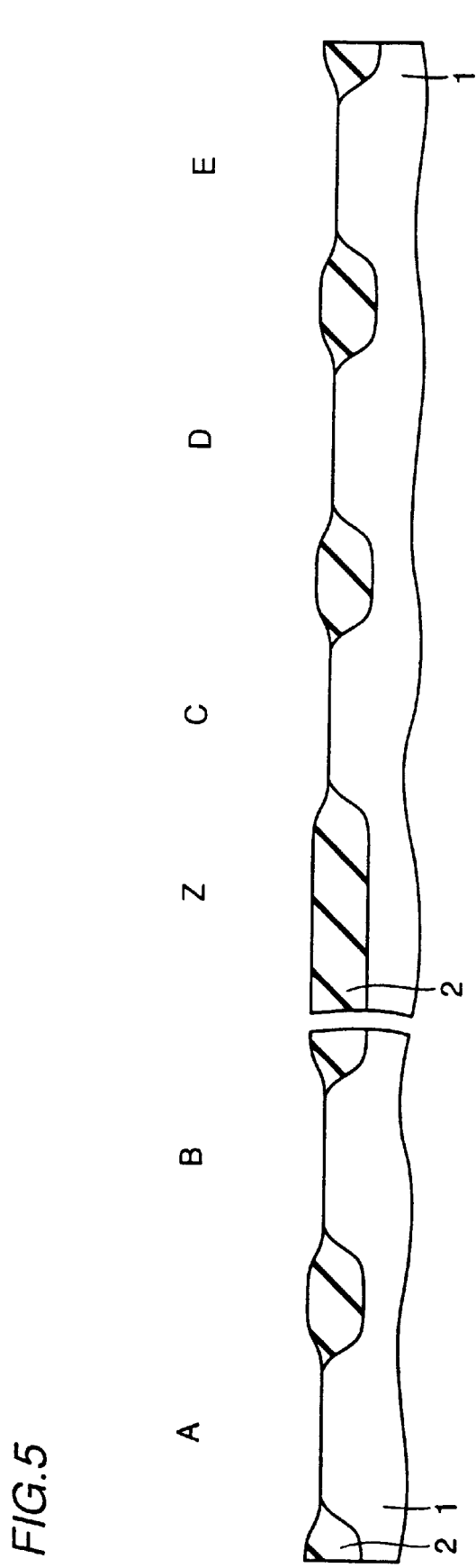

With reference to FIG. 4, silicon substrate 1 is prepared. With reference to FIG. 5, an isolation oxide film 2 is formed in the main surface of silicon substrate 1 by LOCOS method. Then, a well (not shown) is formed as needed.

Figure 6:
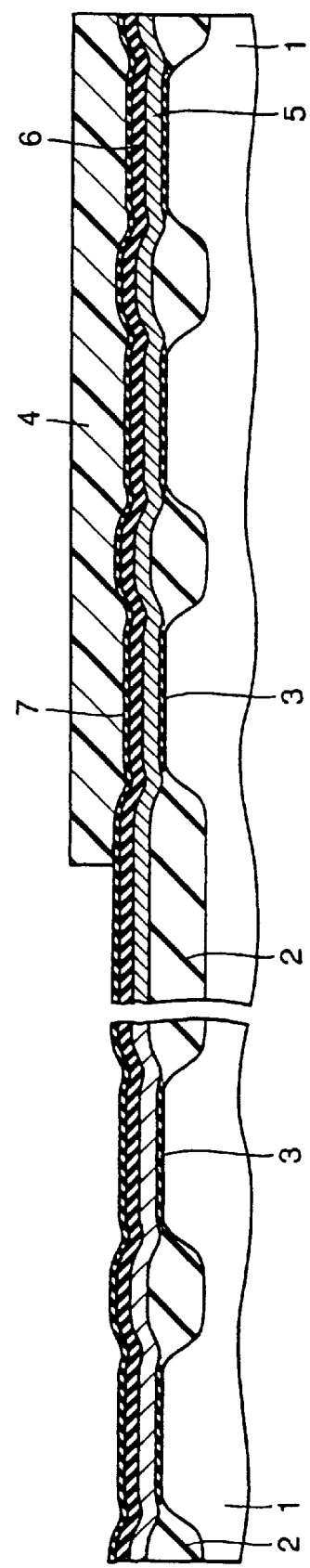

With reference to FIG. 6, a gate oxide film 3 is formed on silicon substrate 1. A gate electrode film 5 of polycrystalline silicon or the like for transistors is formed on gate oxide film 3. An oxide film 6 is formed on gate electrode film 5 by a low pressure CVD (Chemical Vapor Deposition). An anti-oxidation film 7 such as a nitride film and a nitride oxide film is formed on oxide film 6. The purpose of forming anti-oxide film 7 will be described later.

Next, a resist pattern 4 is formed on the portion other than the portion to have a thinner gate oxide film (that is, on the portion corresponding to logic type transistors A and B requiring driving ability).

Figure 7:
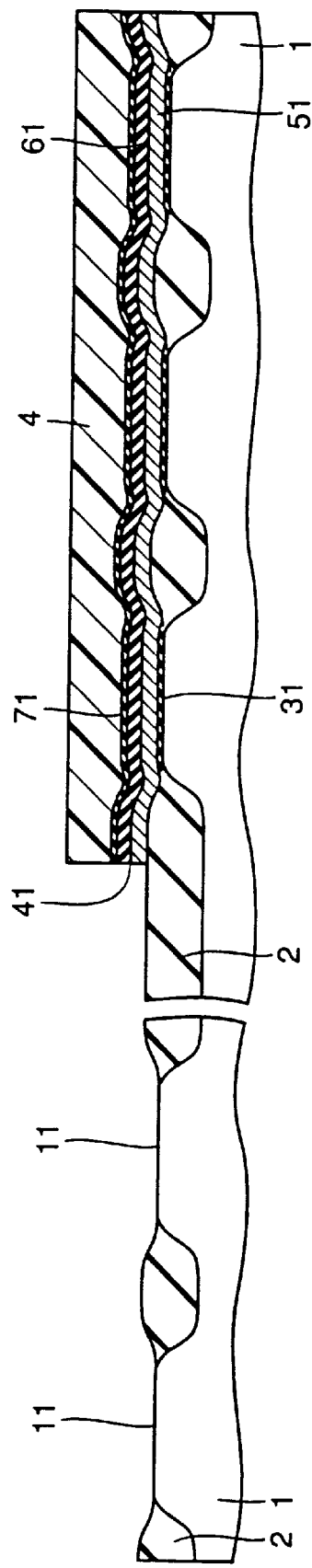
Figure 8:
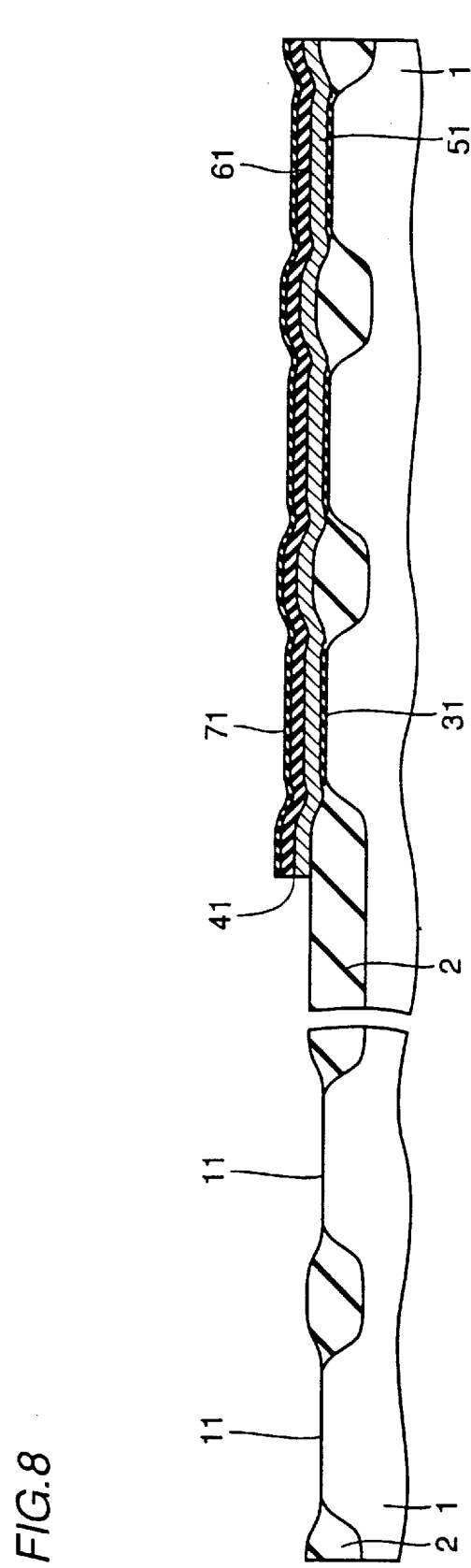
Figure 15:
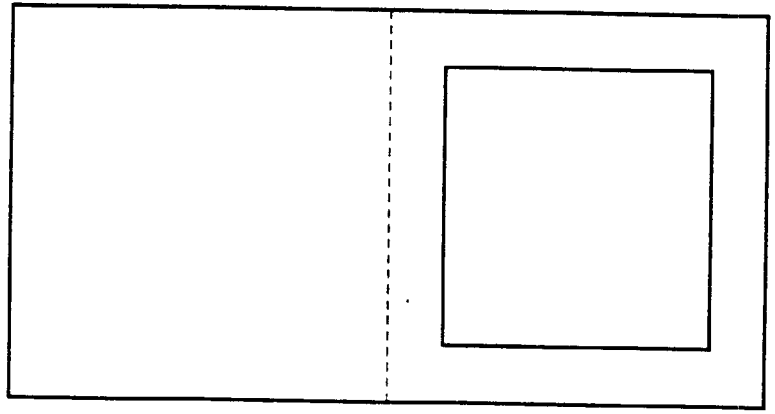
FIGS. 15 to 19 are plan views of a semiconductor device shown in FIGS. 8 to 12.
Figure 16:
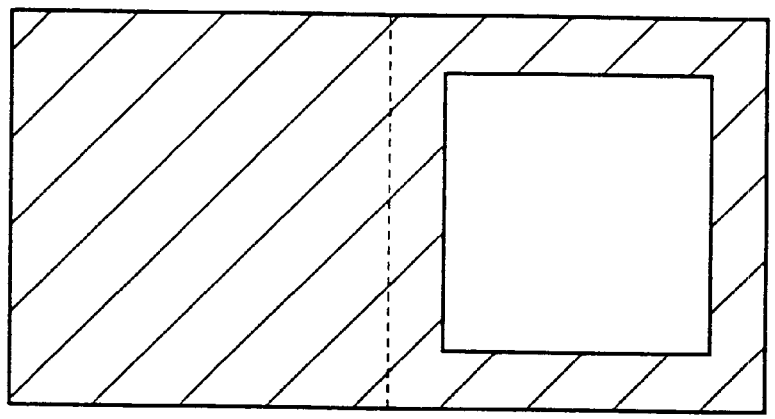

With reference to FIGS. 6 and 7, gate electrode film 5, oxide film 6 and anti-oxide film 7 are patterned using resist pattern 4 as a mask. As a result, gate oxide film 31, gate electrode film 51, oxide film 61 and anti-oxide film 71 are formed, and the surface 11 of silicon substrate 1 is exposed. At this point, the end surface 41 of gate electrode film 51, oxide film 61 and anti-oxide film 71 is formed. With reference to FIGS. 7, 8 and 15, resist pattern 4 is removed.

Figure 9:
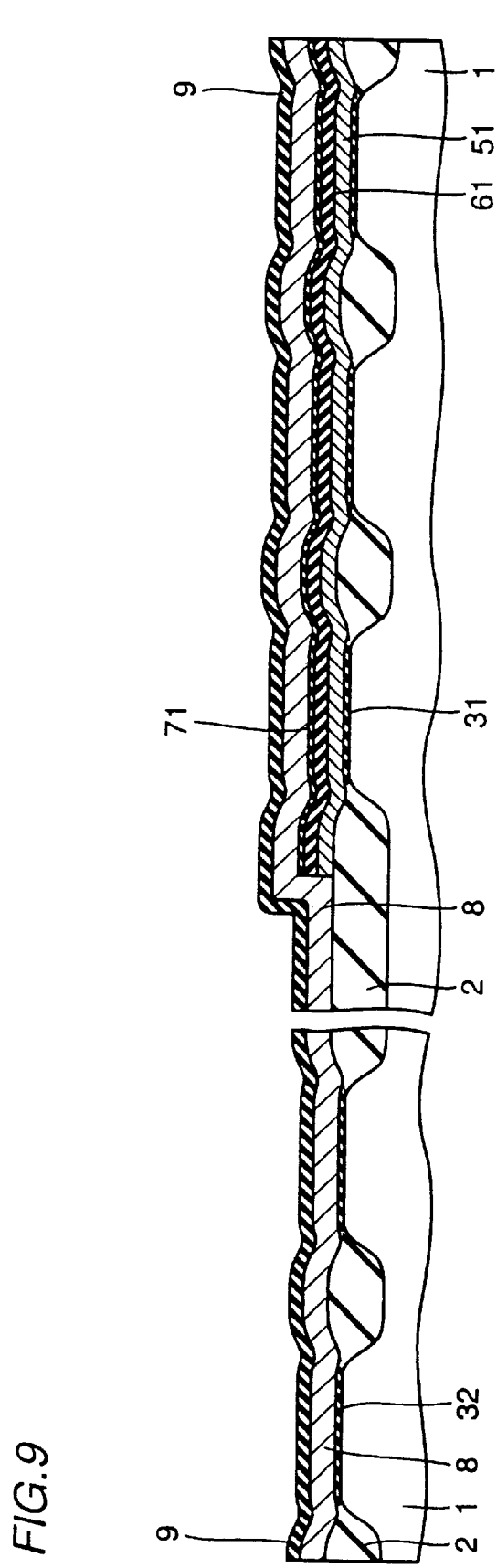
Figure 10:
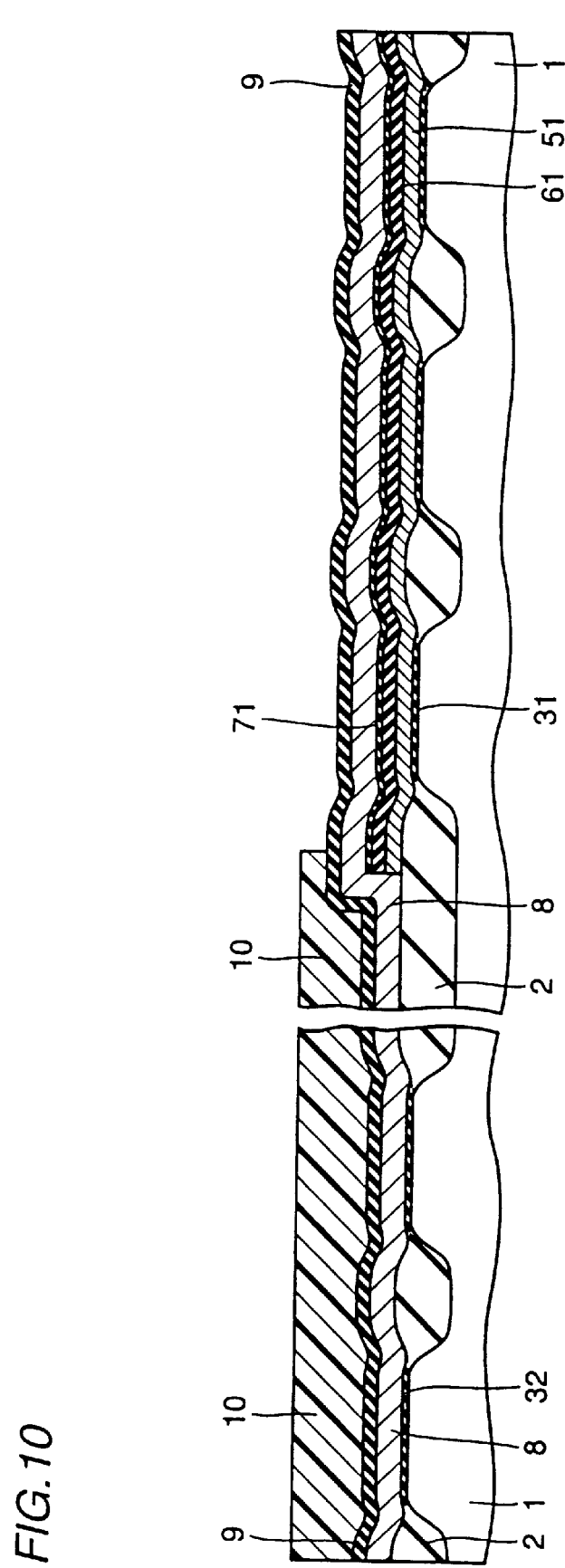

With reference to FIGS. 9 and 10, a usual gate oxide film 32 is formed again by thermal oxidation. Gate oxide films 31 and gate electrode film 51 are not affected by this thermal oxidation as there are protected by anti-oxide film 71 and oxide film 61. This is followed by formation of a gate electrode film 8 and an oxide film 9 for transistors formed in portions A and B on the entire surface of silicon substrate 1. It is noted that the above mentioned gate oxide film 32 is made thinner than gate oxide film 31. The quality and thickness of gate electrode film 8 and oxide film 9 may be different from those of gate electrode film 50 and oxide film 61.

Figure 17:
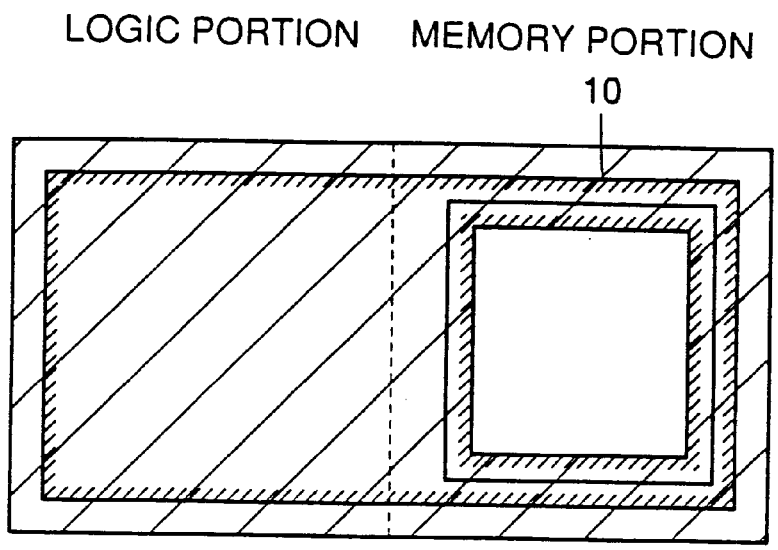

With reference to FIGS. 10 and 17, a resist pattern 10 having an opening which exposes portions of gate electrode film 8 and oxide film 9 formed in the portion for a memory device is formed.

Figure 11:
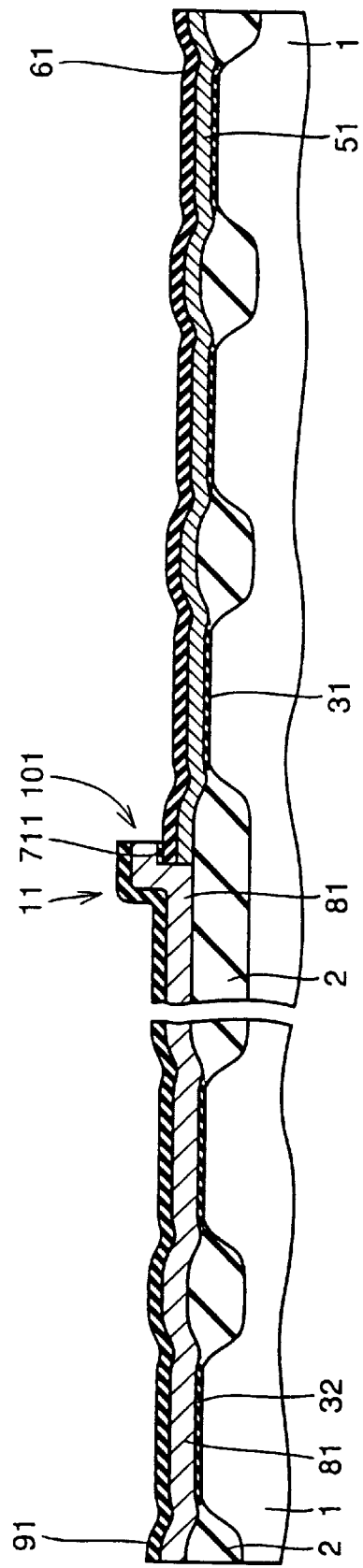
Figure 18:
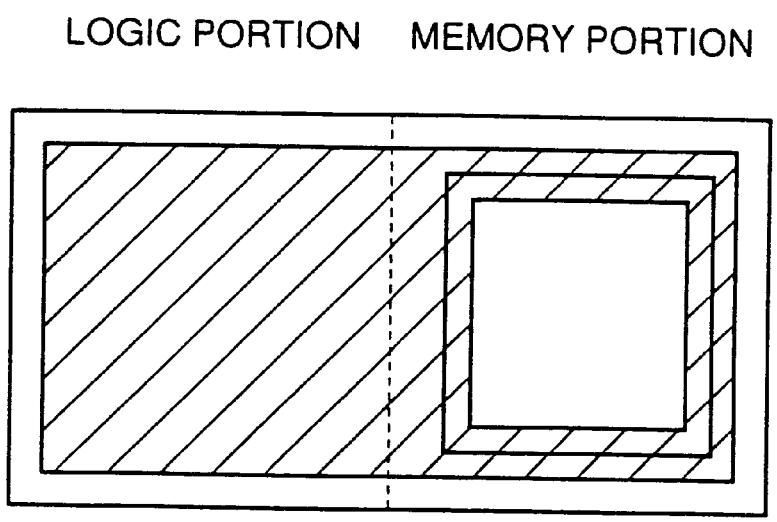

With reference to FIGS. 10, 11 and 18, gate electrode film 8 and oxide film 9 are selectively removed using resist pattern 10 as a mask. This allows a gate electrode film 81 and an oxide film 91 to be formed. The ends of gate electrode 81 and oxide film 91 strand on gate electrode film 51 and oxide film 61, resulting in a stranding portion 11. Further, end surface 101 of gate electrode film 81 and oxide film 91 is exposed. In addition, a portion 711 of the anti-oxidation film is left.

It is noted that anti-oxidation film 71 can be removed from or left on oxide film 61 depending on the above mentioned etching condition. FIG. 11 shows a view where anti-oxidation film 71 is completely removed from the surface of oxide film 61.

Figure 12:
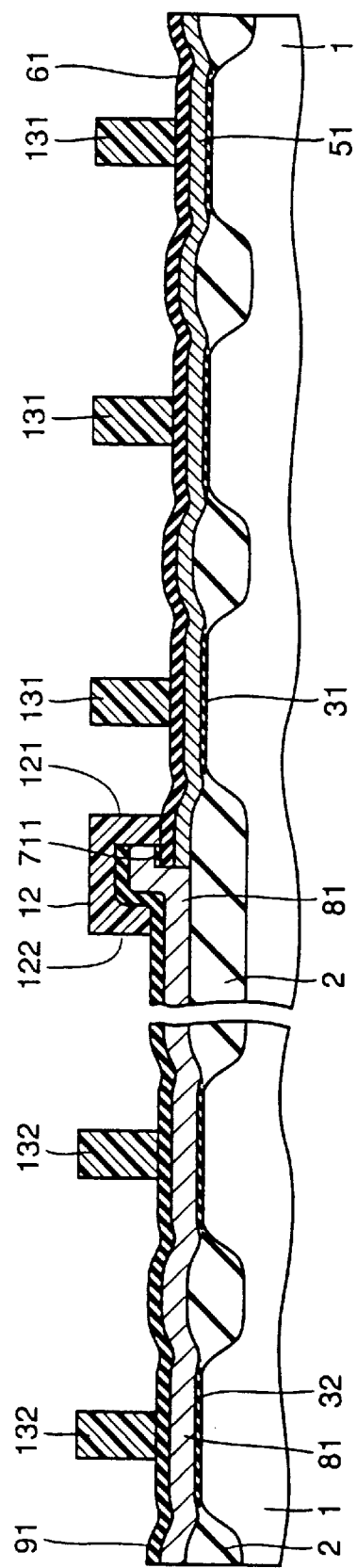
Figure 19:
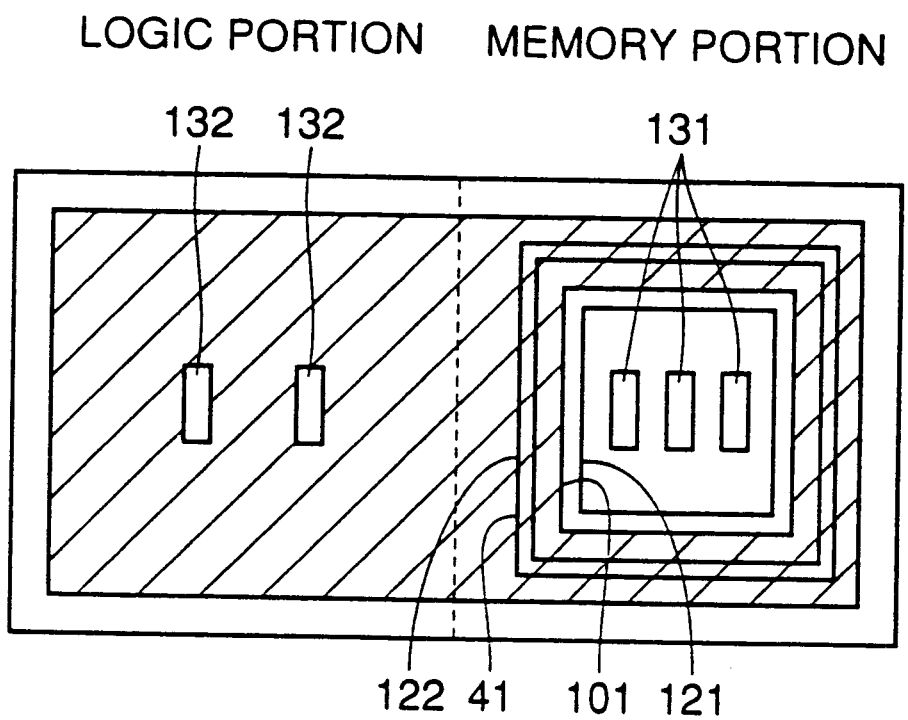

With reference to FIGS. 12 and 19, resist patterns 131 and 132 are formed in the portions where gate electrodes are to be formed. At the same time, a resist pattern 12 having end surfaces 121 and 122 are formed over stranding portion 11.

Figure 13:
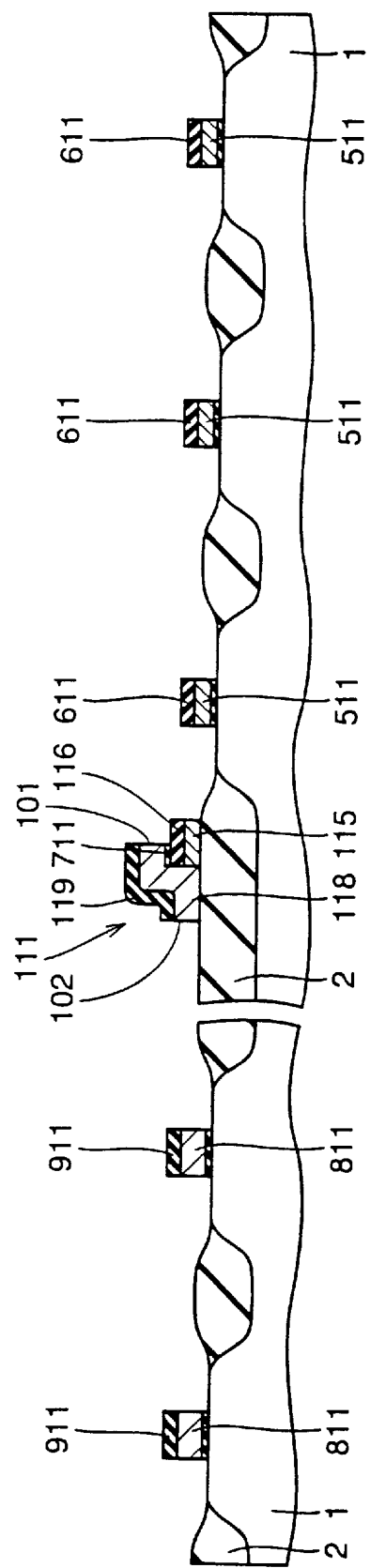

With reference to FIGS. 12, 13 and 19, oxide films, 61 and 91 are selectively removed by anisotropic etching using resist patterns 12, 131 and 132 as masks. Subsequently, resist patterns 12, 131 and 132 are removed. Next, gate electrodes 511 and 811 are formed by selectively etching gate electrode films 81 and 51 using the resulting patterns of oxide films as masks. At this time, a stranding portion 111 including an upper oxide film 119, an upper electrode 118, a lower oxide film 116, a lower electrode 115 and an anti-oxidation film 711 is formed at the same time.

It is noted that oxide films 61 and 91 as well as gate electrode films 51 and 81 are not simultaneously etched using resist patterns 131 and 132 for the following reason. That is, the thickness of gate oxide film 31 differs from that of gate oxide film 32, and therefore, the etching process using the oxide film as a mask results in larger process margin when the selecting ratio of gate electrode films 51 and Si to gate oxide films 31 and 32 is considered.

Subsequently, the formation processes for a conventional source/drain is undergone.

Figure 14:
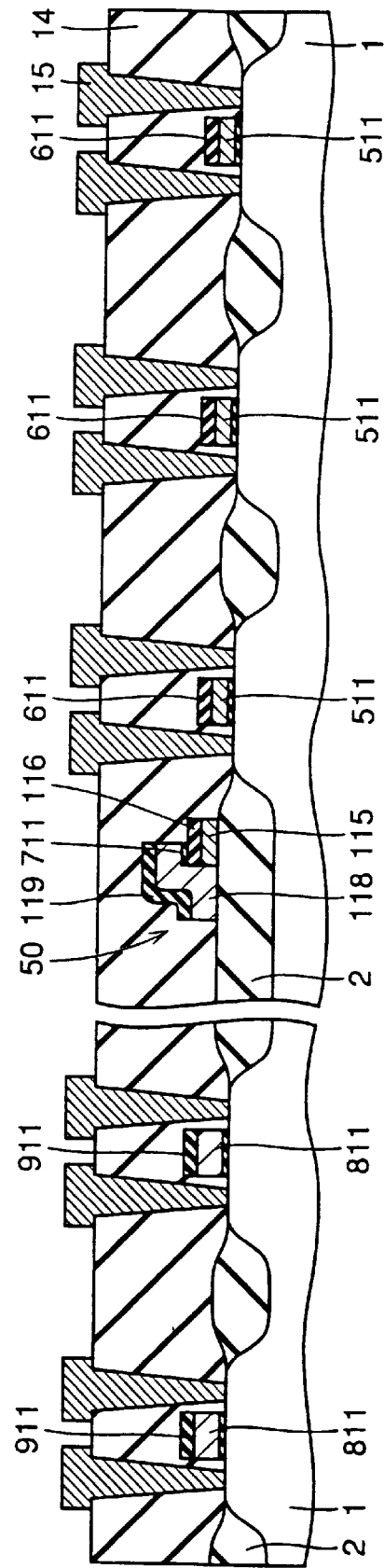

With reference to FIGS. 14, forming an interlayer insulation film 14 on silicon substrate 1, and then contact holes and interconnection layers 15 results in an eRAM.

The reason for forming stranding portion 11 in FIG. 11 will now be described.

Figure 20:
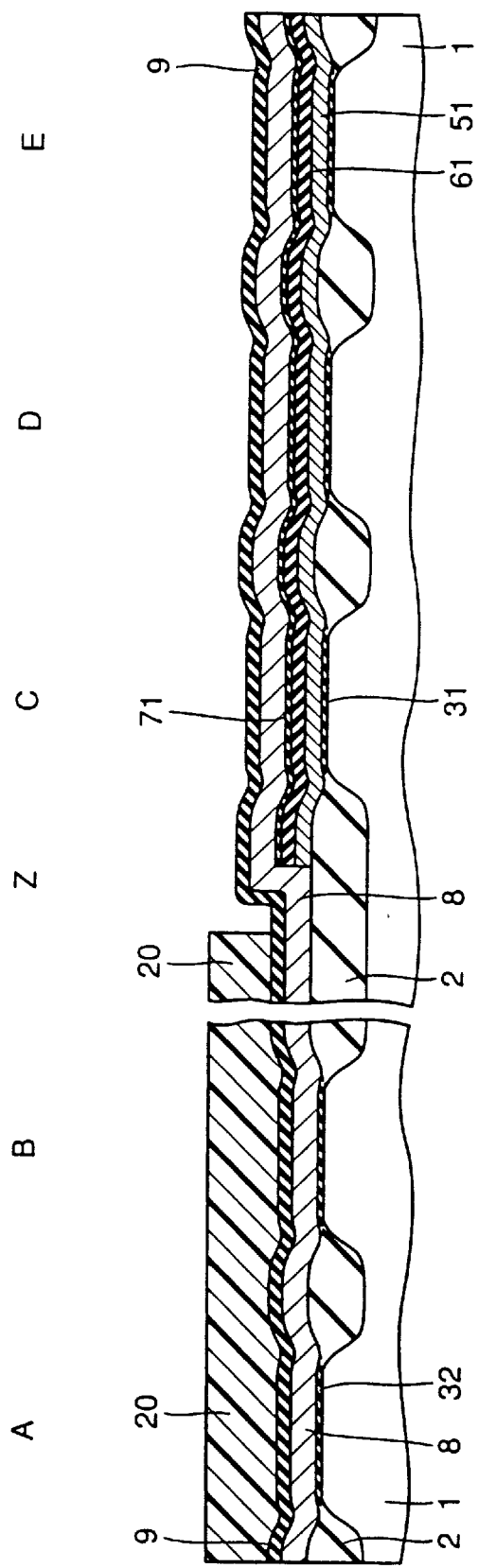
FIGS. 20 to 22 are cross sectional views of the first to third steps for additionally showing the effect of the present invention.
Figure 21:
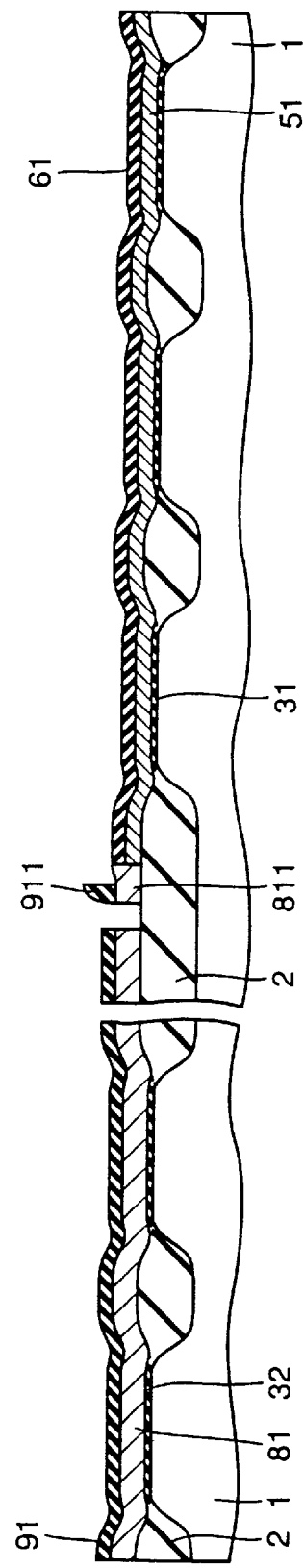
Figure 22:
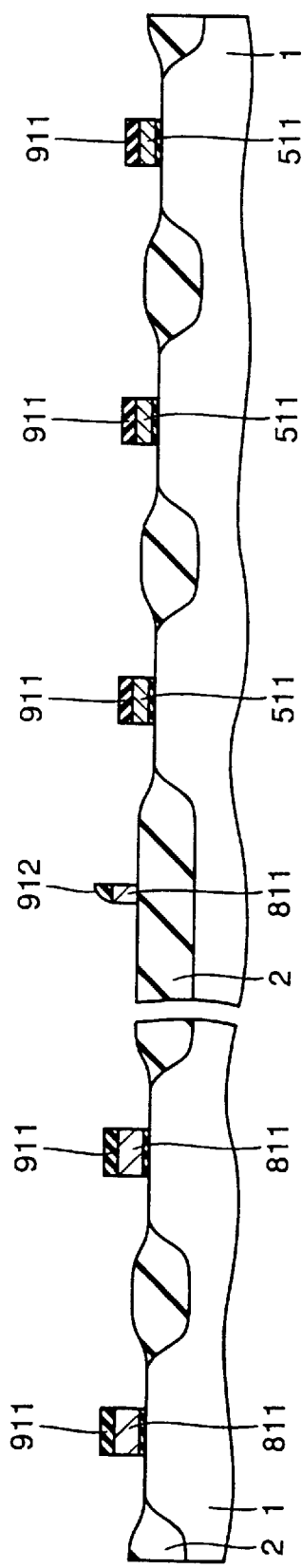

Comparing FIG. 10 with FIG. 20, formation of resist pattern 20 not allowing the formation of a stranding portion allows an oxide film residues 911 and a gate electrode residues 811 to be formed as residues as shown in FIG. 21. With reference to FIGS., 21 and 22, an oxide film residue 912 and a gate electrode residue 812 remain even after formation of gate electrodes 511 and 811. Then, these residues become particles or the like, adversely affecting the performance of a semiconductor device. Thus, stranding portion 11 as shown in FIG. 11 must be provided to prevent the formation of such residues 812 and 912.

Embodiment 2

With reference to FIG. 13, in Embodiment 1, upper oxide film 119 and upper electrode 118 have their respective end surfaces 101 and 102 in stranding portion 111. Being formed by anisotropic etching, these end surfaces 101 and 102 have surfaces vertical to the semiconductor substrate surface, thereby resulting in steps. The steps will cause etch residues in a succeeding step of forming a data line for a memory device, particularly for a DRAM device. Embodiment 2 provides a method for avoiding this problem. After the processes of FIG. 1 in Embodiment 1 is completed, with reference to FIG. 23, an oxide film 16 is formed on the entire surface of silicon substrate 1.

Figure 23:
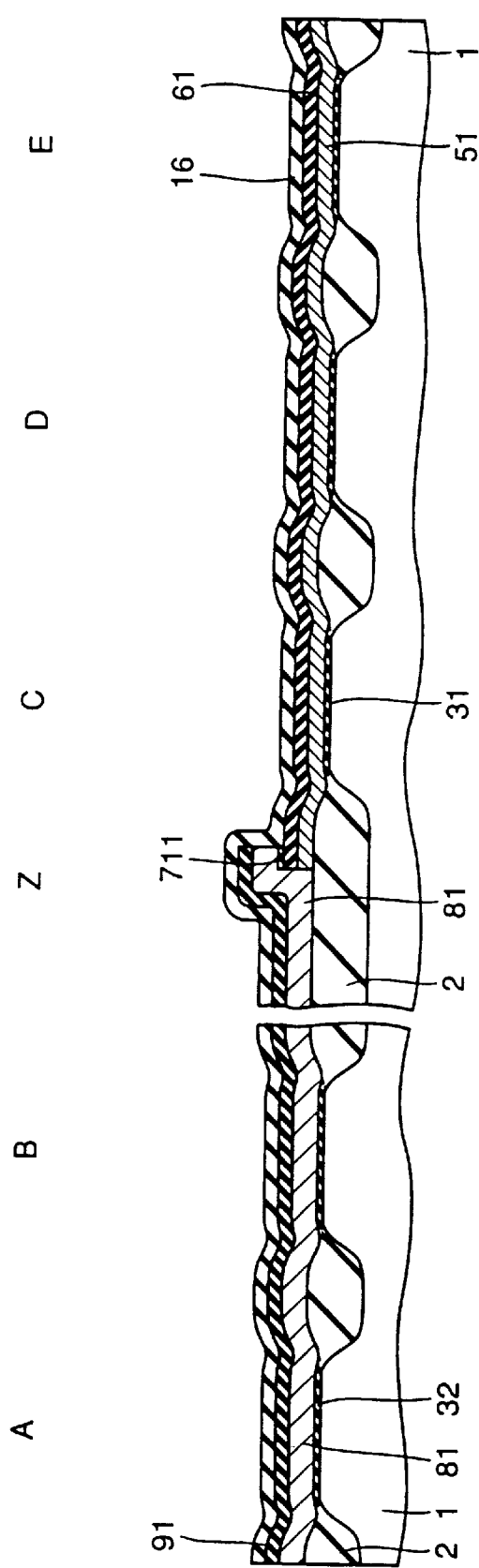
FIGS. 23 to 25 are cross sectional showing the first to third steps of a method of manufacturing a semiconductor device in accordance with the Embodiment 2.
Figure 24:
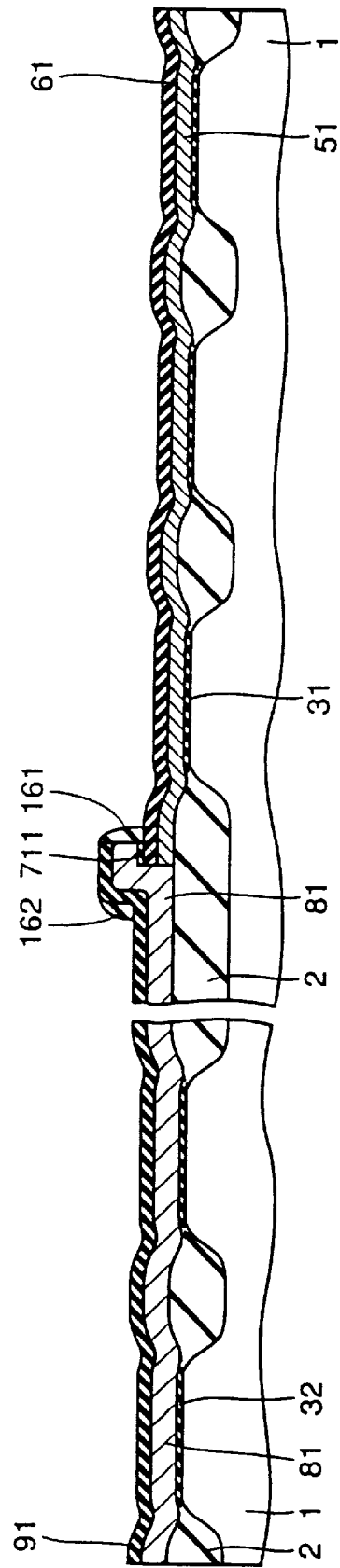
Figure 25:
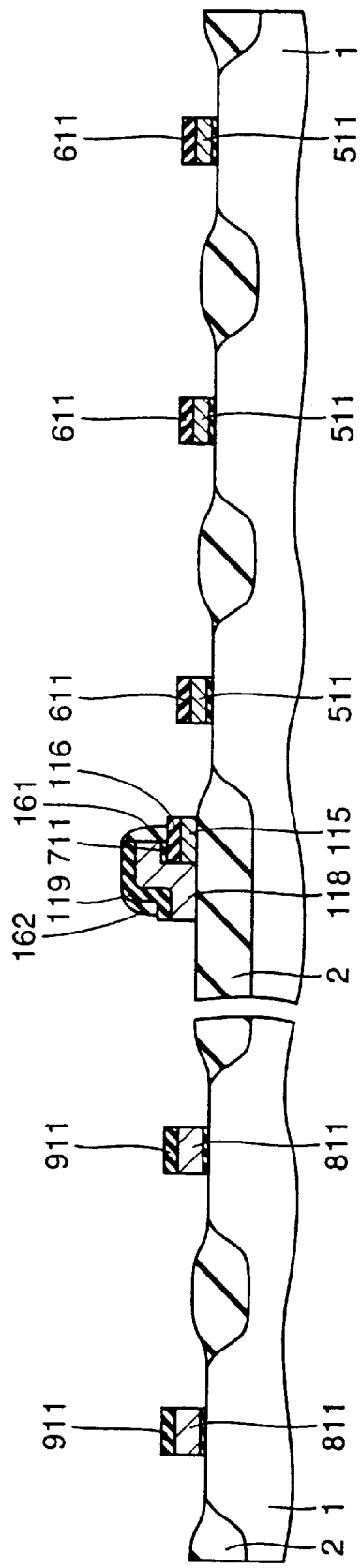
Figure 26:
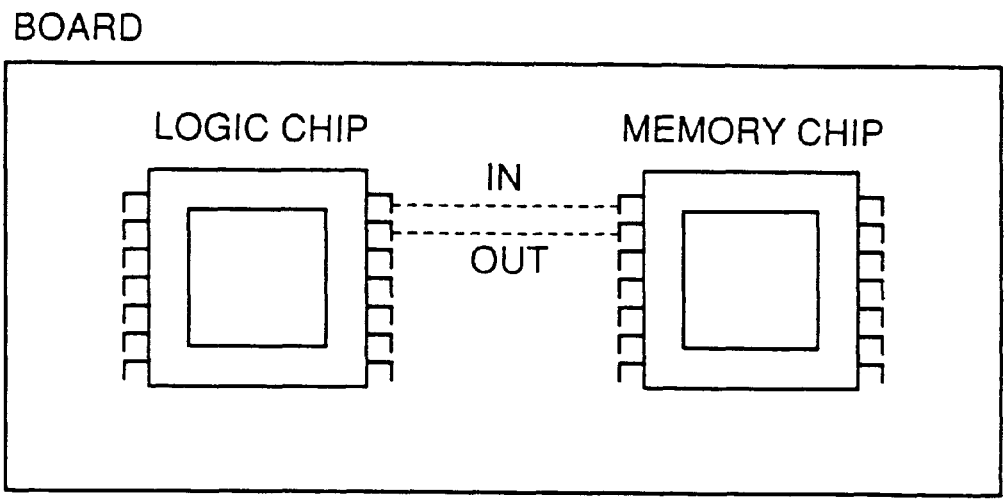
FIG. 26 is an illustration of an eRAM device.
Figure 27:
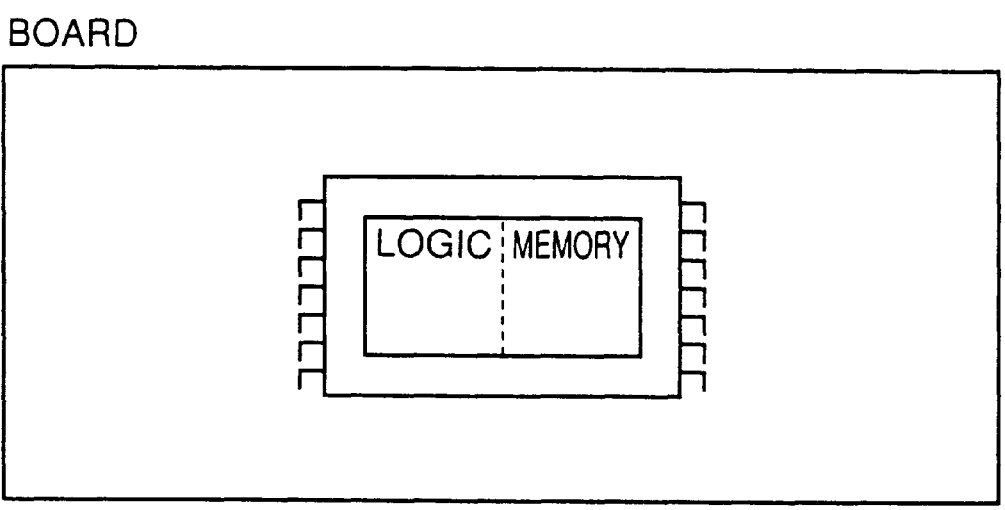
FIG. 27 is an illustration of an eRAM device.
Figure 28:
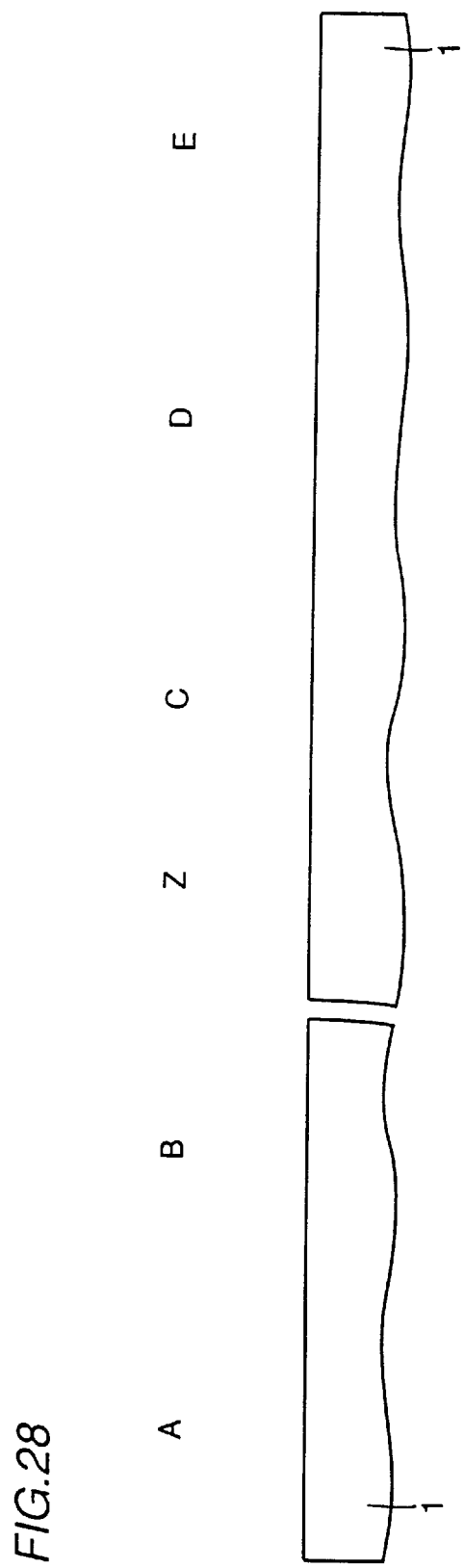
FIGS. 28 to 37 are cross sectional views showing the first to tenth steps of a method of manufacturing an eRAM device possible with a conventional technique.
Figure 29:
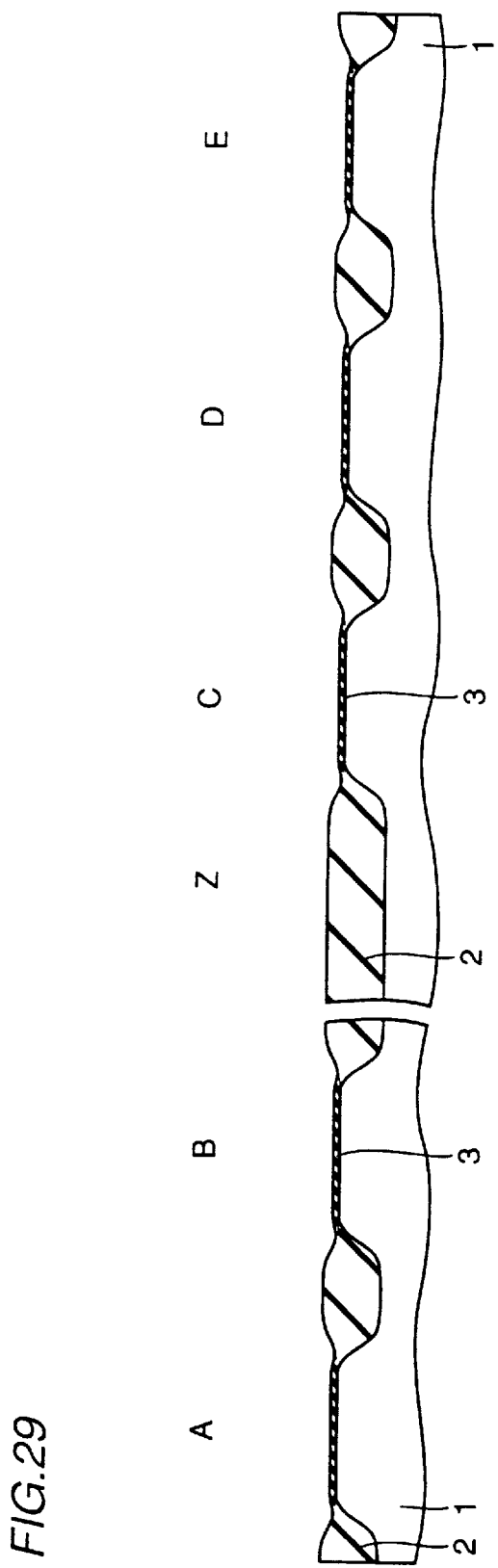
Figure 30:
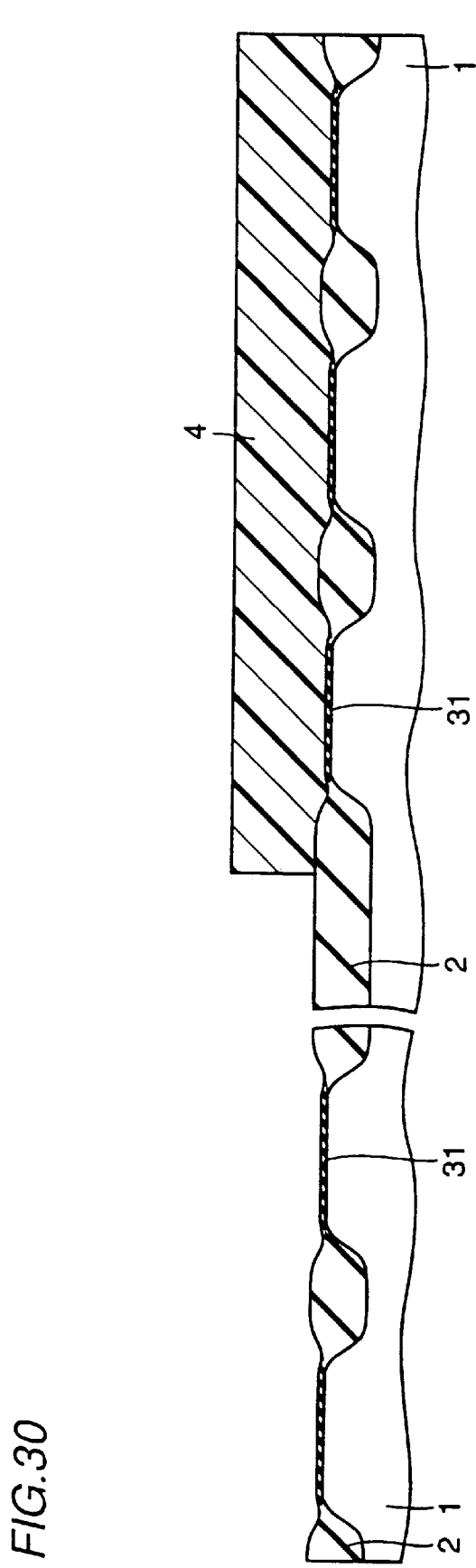
Figure 31:
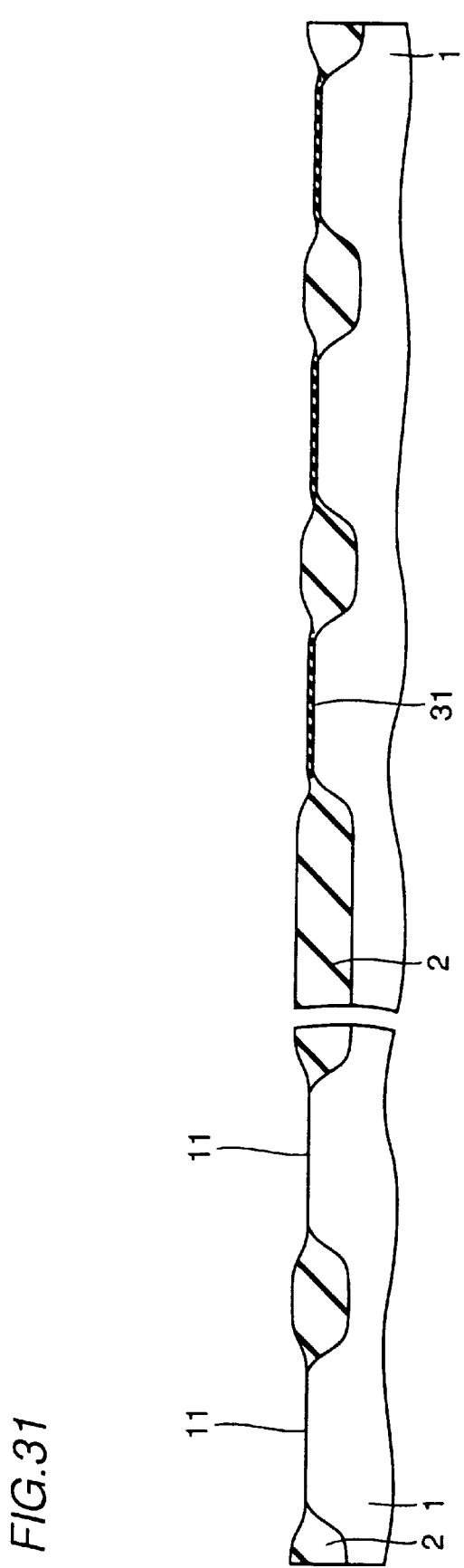
Figure 32:
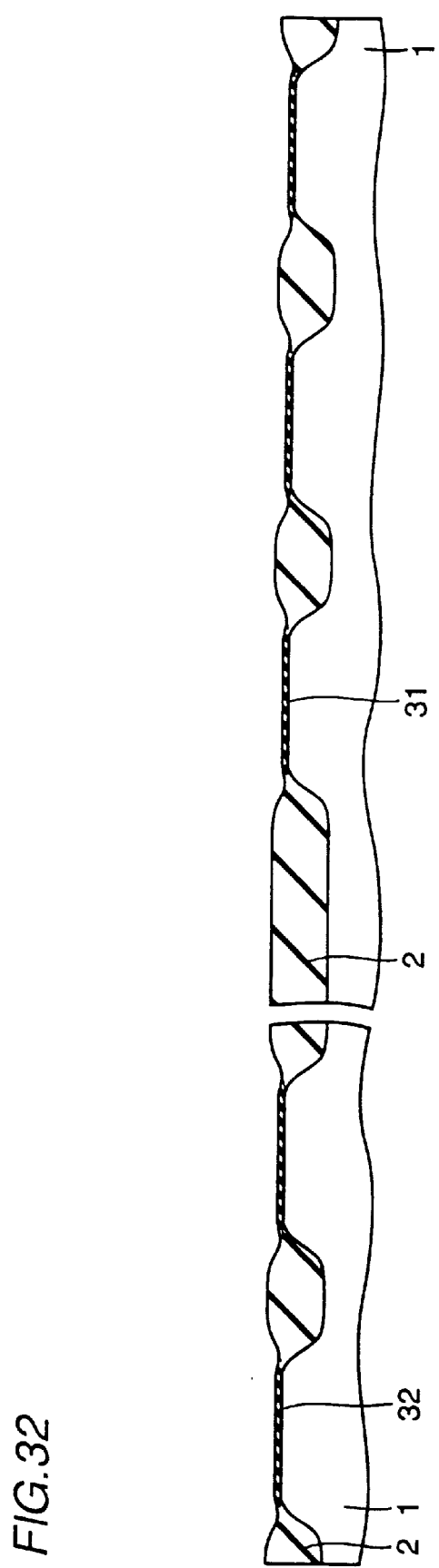
Figure 33:
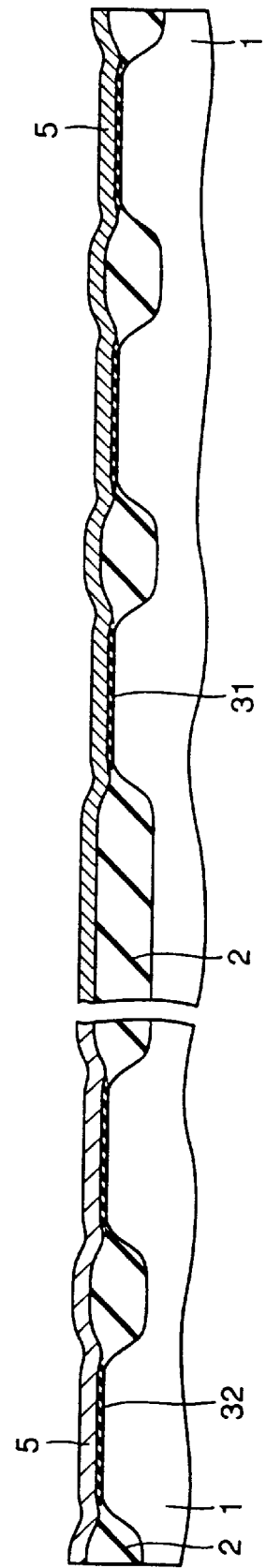
Figure 34:
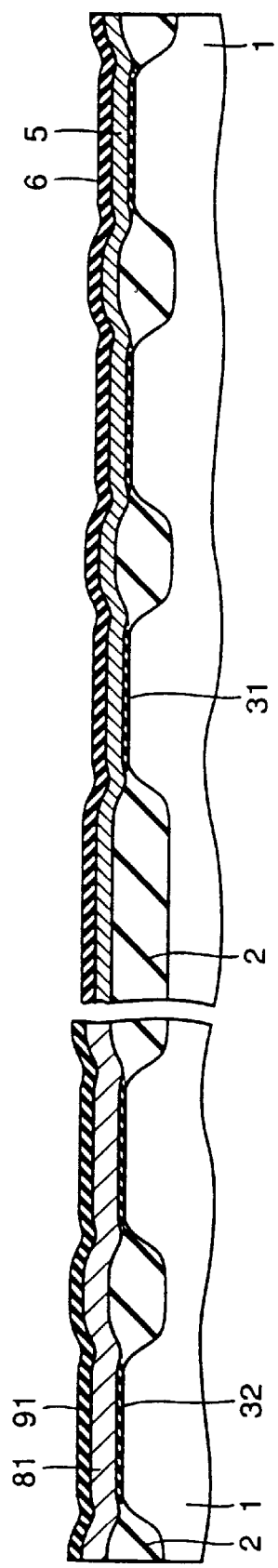
Figure 35:
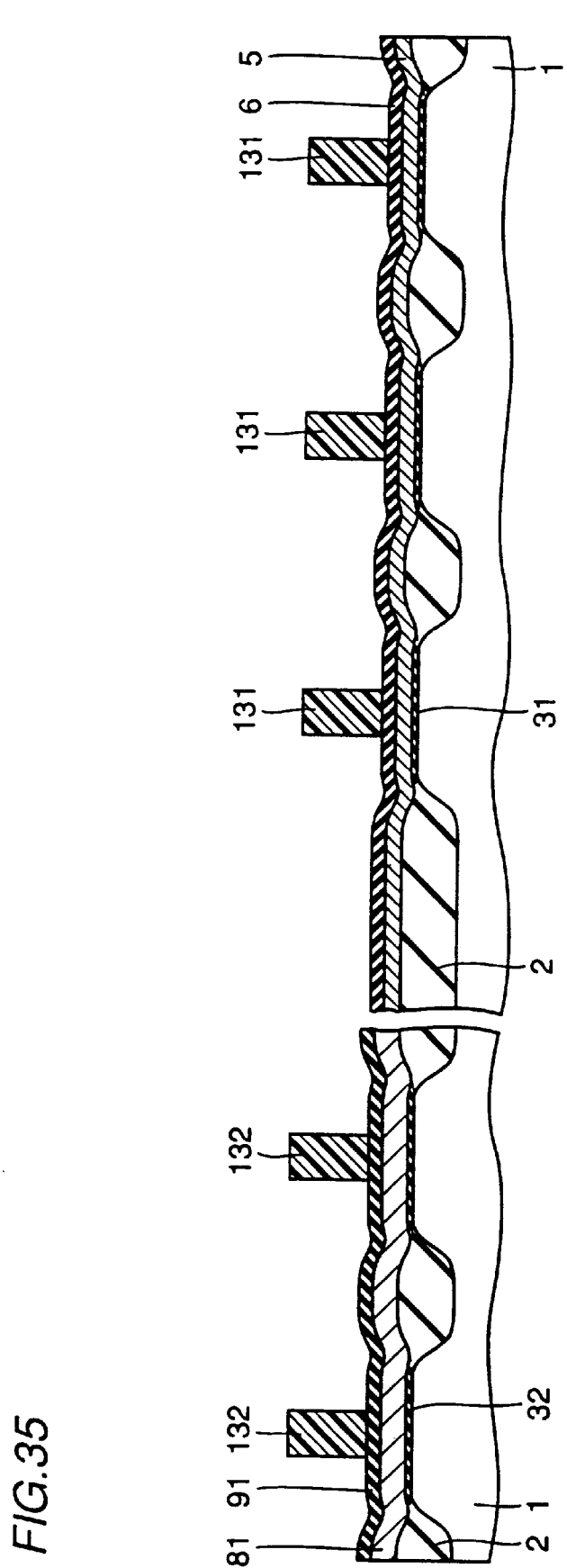
Figure 36:
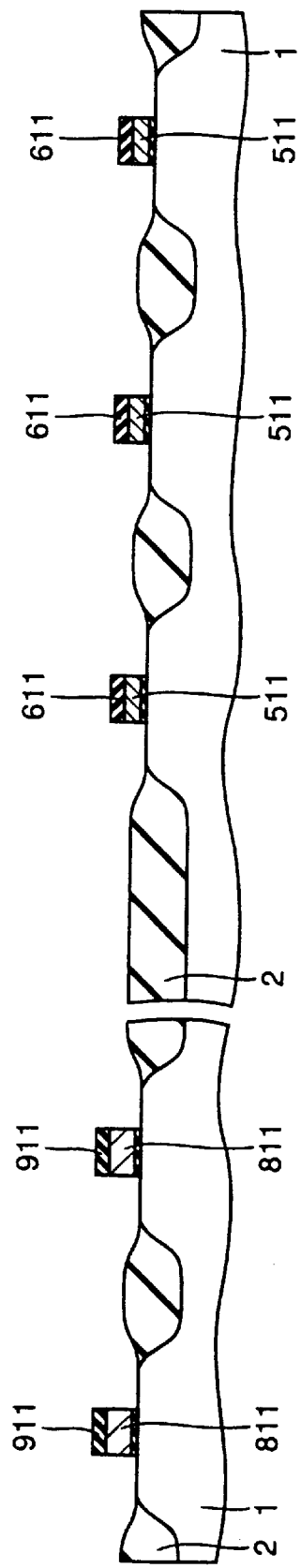
Figure 37:
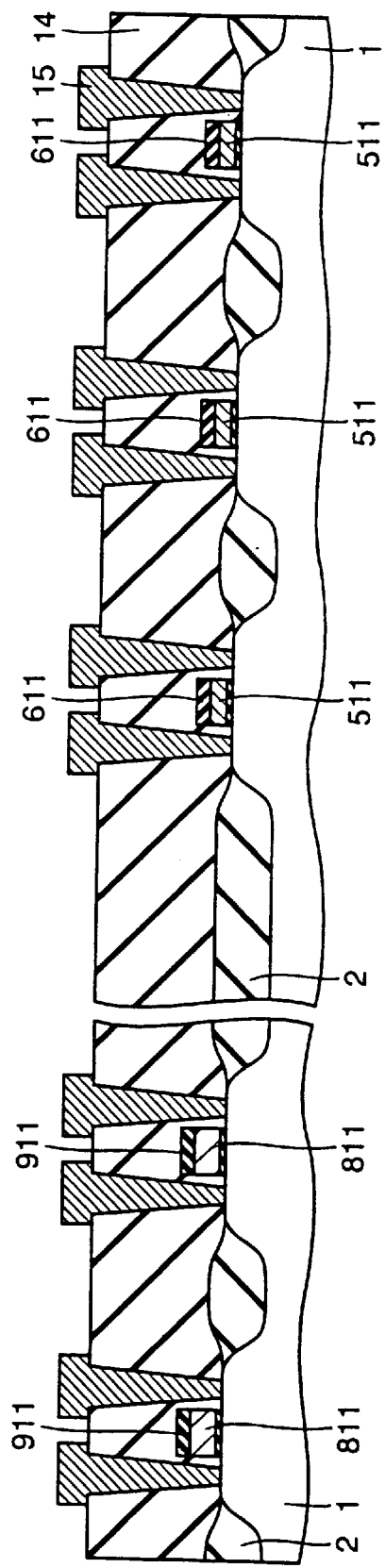

With reference to FIGS. 23 and 24, oxide film 16 is etched back to form frames 161 and 162. Then, undergoing a process in FIG. 12 results in a semiconductor device shown in FIG. 25. Subsequently, a process shown in FIG. 14 completes an eRAM. According to the present embodiment, frames 161 and 162 reduce steps, so that no etch residue is produced.

Embodiment 3

With reference to FIG. 13, in Embodiment 1, oxide films 611 and 911 are formed on gate electrodes 511 and 811.

However, the steps can proceed without forming oxide films 611 and 911. In this case, the step of forming oxide film 6 in FIG. 6 is omitted. Then, undergoing the processes the same as those for Embodiment 1 results in an eRAM without oxide films 611 and 911.

Embodiment 4

With reference to FIG. 13, in Embodiment 1, gate electrodes 511 and 811 are formed of polycrystalline silicon. The present invention, however, is not limited to this, and they may be a polycide or salicide (self aligned silicide) structure.

Embodiment 5

With reference to FIG. 23, in Embodiment 2, oxide film 16 is formed on the entire surface of silicon substrate 1. The present invention, however, is not limited to this, and other films with insulation property such as a nitride film and a nitride oxide film may be formed.

In a semiconductor device in accordance with the first aspect of the invention, a conductive film is provided on an isolation region. Such a semiconductor device can be effectively manufactured with a method to provide enhanced reliability for a gate oxide film.

In a semiconductor device in accordance with the second aspect of the invention, the thickness of a first gate insulation film is different from that of a second gate insulation film, and therefore, a gate oxide film in the portion for a logic type transistor requiring driving ability can be formed thinner and a gate oxide film for a memory device type transistor thicker.

In a semiconductor device in accordance with the third aspect of the invention, first and second element regions include a memory device region and a logic device region, respectively, thereby resulting in a device having a memory device and a logic device formed together on a single chip.

In a semiconductor device in accordance with the fourth aspect of the invention, a floating conductive film is provided to surround the memory device region. Such a semiconductor device can be manufactured using a method capable of enhancing the reliability of a gate oxide film.

In a semiconductor device in accordance with the fifth aspect of the invention, a second conductive film is provided such that a portion of the second conductive film overlaps a first conductive film, thereby avoiding the formation of particles which would cause contamination for a semiconductor device in the subsequent steps of manufacturing.

In a semiconductor device in accordance with the sixth aspect of the invention, a general LOCOS method can be used as an isolation region is formed of an SiO$_2$ film.

In a semiconductor device in accordance with the seventh aspect of the invention, the first and second conductive films respecizvely include first and second insulation films, and therefore, such a semiconductor device can be formed using a method which increases process margin.

In a semiconductor device in accordance with the eighth aspect of the invention, a portion of the second conductive film overlaps the first conductive film with an anti-oxidation film interposed therebetween, and therefore, such a semiconductor device can be formed using a method to provide a memory type transistor with enhanced reliability.

In a semiconductor device in accordance with the ninth aspect of the invention, a sidewall of the second conductive film is provided with a sidewall spacer, so that a problem associated with etch residues can be avoided, thereby resulting in a semiconductor device with enhanced reliability.

In a method of manufacturing a semiconductor device in accordance with the tenth aspect of the invention, a resist pattern is not directly formed on a gate oxide film for a memory transistor, and therefore, enhanced reliability for the gate oxide film is achieved.

In a method of manufacturing a semiconductor device in accordance with the eleventh aspect of the present invention, a first insulation film is formed on a conductive film prior to the formation or an anti-oxidation film on the conductive film, so that a gate electrode film can be etched using the first insulation film as a mask. As a result, process margin is increased.

In a method of manufacturing a semiconductor device in accordance with the twelfth aspect of the invention, the gate electrode film can be etched using a second insulation film as a mask, and therefore, process margin is increased.

In a method of manufacturing a semiconductor device in accordance with the thirteenth aspect of the invention, a sidewall spacer is formed on a sidewall of the end of a precursor film for a second MOS structure, thereby avoiding steps and a problem associated with etch residues.

In a method of manufacturing a semiconductor device in accordance with the fourteenth aspect of the invention, first and second element regions respectively include memory device and logic device regions, and a floating conductive film is formed to surround the memory device region, thereby resulting in an eRAM with enhanced reliability having a memory device and a logic device formed together.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising;

a first step of forming an isolation region separating a first element region from a second element region on a semiconductor substrate;

a second step of forming a first gate insulation film on said first element region and second element region;

a third step of forming a conductive film on the entire surface of said semiconductor substrate, and also forming an anti-oxidation film on said conductive film;

a fourth step of selectively etching said conductive film and said anti-oxidation film to be patterned, thereby forming a first precursor film later to be a first gate electrode of a first MOS structure having a first conductive film and an anti-oxidation film and its end stranded on said isolation region on said first element region, and at the same time exposing a surface of said second element region;

a fifth step of oxidizing said exposed surface of said second element region to form a second gate insulation film;

a sixth step of forming a second precursor film later to be a second gate electrode of a second MOS structure such that the end of said second precursor film strands on said end of said first precursor film formed on said isolation region on said second element region; and a seventh step of patterning said first precursor film and said second precursor film such that said first gate electrode of said first MOS structure is left on said first element region, said second gate electrode of said second MOS structure is left on said second element region and a conductive film formed of a portion where said end of said second precursor film overlaps said end of said first precursor film is left on said isolation region.

2. The method of manufacturing a semiconductor device according to claim 1, further including the step of forming a first insulation film on said conductive film prior to formation of said anti-oxidation film on said conductive film.

3. The method of manufacturing a semiconductor device according to claim 1, wherein said second precursor film includes a second conductive film and a second insulation film provided on said second conductive film.

4. The method of forming a semiconductor device according to claims 1, further including the step of forming a sidewall spacer on a sidewall of said end of said second precursor film prior to said seventh step after said sixth step.

5. The method of forming a semiconductor device according to claim 1, wherein said first element region includes a memory device region, said second element region includes a logic device region, and said conductive film is formed to surround said memory device region.

* * * * *